United States Patent
Iyer et al.

(10) Patent No.: US 7,465,669 B2
(45) Date of Patent: Dec. 16, 2008

(54) METHOD OF FABRICATING A SILICON NITRIDE STACK

(75) Inventors: R. Suryanarayanan Iyer, St. Paul, MN (US); Sanjeev Tandon, Sunnyvale, CA (US); Kangzhan Zhang, Fremont, CA (US); Rubi Lapena, San Jose, CA (US); Yuji Maeda, Sakae-machi (JP)

(73) Assignee: Applied Materials, Inc., Santa Clara, CA (US)

( * ) Notice: Subject to any disclaimer, the term of this patent is extended or adjusted under 35 U.S.C. 154(b) by 422 days.

(21) Appl. No.: 11/273,380

(22) Filed: Nov. 12, 2005

(65) Prior Publication Data

US 2007/0111538 A1    May 17, 2007

(51) Int. Cl.
*H01L 21/311* (2006.01)

(52) U.S. Cl. .............. 438/700; 438/311; 438/680; 257/E21.17; 257/E21.32; 257/E21.293; 257/E21.304; 257/E21.546

(58) Field of Classification Search .......... 438/700, 438/238, 381, 197, 311, 439, 513, 575, 589, 438/680, 663, 692, 770
See application file for complete search history.

(56) References Cited

U.S. PATENT DOCUMENTS

| | | | |
|---|---|---|---|
| 5,122,889 A | 6/1992 | Kaneko et al. | |
| 5,541,434 A | 7/1996 | Nicholls et al. | |
| 5,670,431 A | 9/1997 | Huanga et al. | |
| 6,501,122 B1 | 12/2002 | Chan et al. | |
| 6,713,127 B2* | 3/2004 | Subramony et al. | 427/255.37 |
| 6,821,825 B2 | 11/2004 | Todd et al. | |
| 7,294,582 B2* | 11/2007 | Haverkort et al. | 438/763 |
| 2003/0124818 A1* | 7/2003 | Luo et al. | 438/482 |
| 2003/0232514 A1 | 12/2003 | Kim et al. | |
| 2004/0061118 A1 | 4/2004 | Yamazaki et al | |
| 2005/0109276 A1 | 5/2005 | Iyer et al. | |
| 2006/0160341 A1 | 7/2006 | Lin et al. | |
| 2006/0260341 A1* | 11/2006 | Meyvis | 62/331 |

OTHER PUBLICATIONS

Smith, J. W., et al., "Thermal Chemical Vapor Deposition of Bis(Tertiary-Butylamino) Silane-baed Silicon Nitride Thin Films", *Journal of the Electrochemical Society*, 152 (4), (2005),G316-G321.
Tamaoki, Naoki , et al., "Low-Temperature Solution for Silicon Nitride LPCVD Using CI-Free Inorganic Trisilylamine", in *Chemical Vapor Deposition XVI and EUROCVD 14*, vol. 1, *Proceedings of the International Sumposium*, M.D. Allendorf et al., Eds.; Proceedings Volumne 2003-08,(2003),693-700.

* cited by examiner

*Primary Examiner*—David Nhu
(74) *Attorney, Agent, or Firm*—Mosier IP Law Group

(57) ABSTRACT

Embodiments of methods for fabricating a silicon nitride stack on a semiconductor substrate are provided herein. In one embodiment, a method for fabricating a silicon nitride stack on a semiconductor substrate includes depositing a base layer including silicon nitride on the substrate using a first set of process conditions that selectively control the stress of the base layer; and depositing an upper layer including silicon nitride using a second set of process conditions that selectively control at least one of an oxidation resistance and a refractive index of the upper layer.

20 Claims, 4 Drawing Sheets

METHOD OF FABRICATING A SILICON NITRIDE STACK

BACKGROUND OF THE INVENTION

1. Field of the Invention

Embodiments of the invention generally relate to methods for depositing silicon-based materials. More specifically, the present invention relates to chemical vapor deposition techniques for fabricating silicon nitride stacks.

2. Description of the Related Art

Manufacturing techniques for fabricating devices on integrated circuits are continually evolving to facilitate the continued shrinkage of the devices formed on the integrated circuit and their more dense arrangement on the substrate. For example, in order to prevent current leakage, each transistor formed on the substrate was traditionally isolated from adjacent transistors through a localized oxidation of silicon (LOCOS) field oxide process. This same function may now be performed using a shallow trench isolation (STI) process to isolate each transistor from its adjacent transistor. The shallow trench isolation takes up less space on the substrate while performing the same function as LOCOS, which in turn increases transistor density on the chip.

However, the STI process creates its own manufacturing challenges. For example, as part of the fabrication process to form an STI structure, a silicon nitride film is typically formed on the substrate by a furnace process utilizing dichlorosilane and ammonia precursors. The fabrication of the thick films (typically about 1500 Angstroms) typically utilized in the STI fabrication process utilizing the standard furnace process results in the deposition of large amounts of material on the furnace walls. The high rate of furnace wall deposition requires greater frequency of preventative maintenance to avoid excess particle generation, thereby lowering productivity and increasing the risk of defects due to particle contamination.

Moreover, furnace films are deposited on both sides of the substrate—the back side silicon nitride film being stripped after patterning the front side of the substrate to make the STI structures. This process results in a high stress level in the silicon nitride film remaining on the substrate, which may cause dislocations to form in or near the STI structures. The dislocations in the substrate or in the STI structures may lead to increased electrical leakage of the transistors disposed proximate the STI structures due to electron hopping along those dislocations. An alternative method using single-wafer chamber and silane-ammonia chemistry for forming silicon nitride film, while meets stress and particle requirements, does not meet requirements of film uniformity.

Thus, there is a need in the art for an improved method for fabricating a silicon nitride stack suitable for use in fabricating a shallow trench isolation structure.

SUMMARY OF THE INVENTION

Embodiments of methods for fabricating a silicon nitride stack on a semiconductor substrate are provided herein. In one embodiment, a method for fabricating a silicon nitride stack on a semiconductor substrate includes depositing a base layer comprising silicon nitride on the substrate using a first set of process conditions that selectively control the stress of the base layer; and depositing an upper layer comprising silicon nitride using a second set of process conditions that selectively control at least one of an oxidation resistance and a refractive index of the upper layer.

In another embodiment, a method of forming a shallow trench isolation structure in a substrate includes depositing a pad oxide layer on the substrate; depositing a silicon nitride stack having a base layer and an upper layer, wherein a stress of the base layer is selectively controlled by a first set of deposition conditions and wherein at least one of an oxidation resistance and a refractive index of the upper layer are selectively controlled by a second set of deposition conditions; depositing and patterning a photoresist layer on the substrate; etching a trench into the substrate through the pad oxide layer and silicon nitride stack; oxidizing the trench to form a liner; filling the linered trench with silicon oxide; and removing excess silicon oxide.

BRIEF DESCRIPTION OF THE DRAWINGS

The teachings of the present invention will become apparent by considering the following detailed description in conjunction with the accompanying drawings, in which.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

The present invention is generally a method for fabricating a silicon nitride stack. The silicon nitride stack may be used, for example, as a pad nitride layer utilized in the formation of shallow trench isolation (STI) structures in integrated semiconductor circuits and devices. STI structures formed as described herein are suitable for use in connection with the fabrication of, for example, field effect transistors (FET), dynamic random access memory (DRAM), flash memory, and the like.

Figure 1:
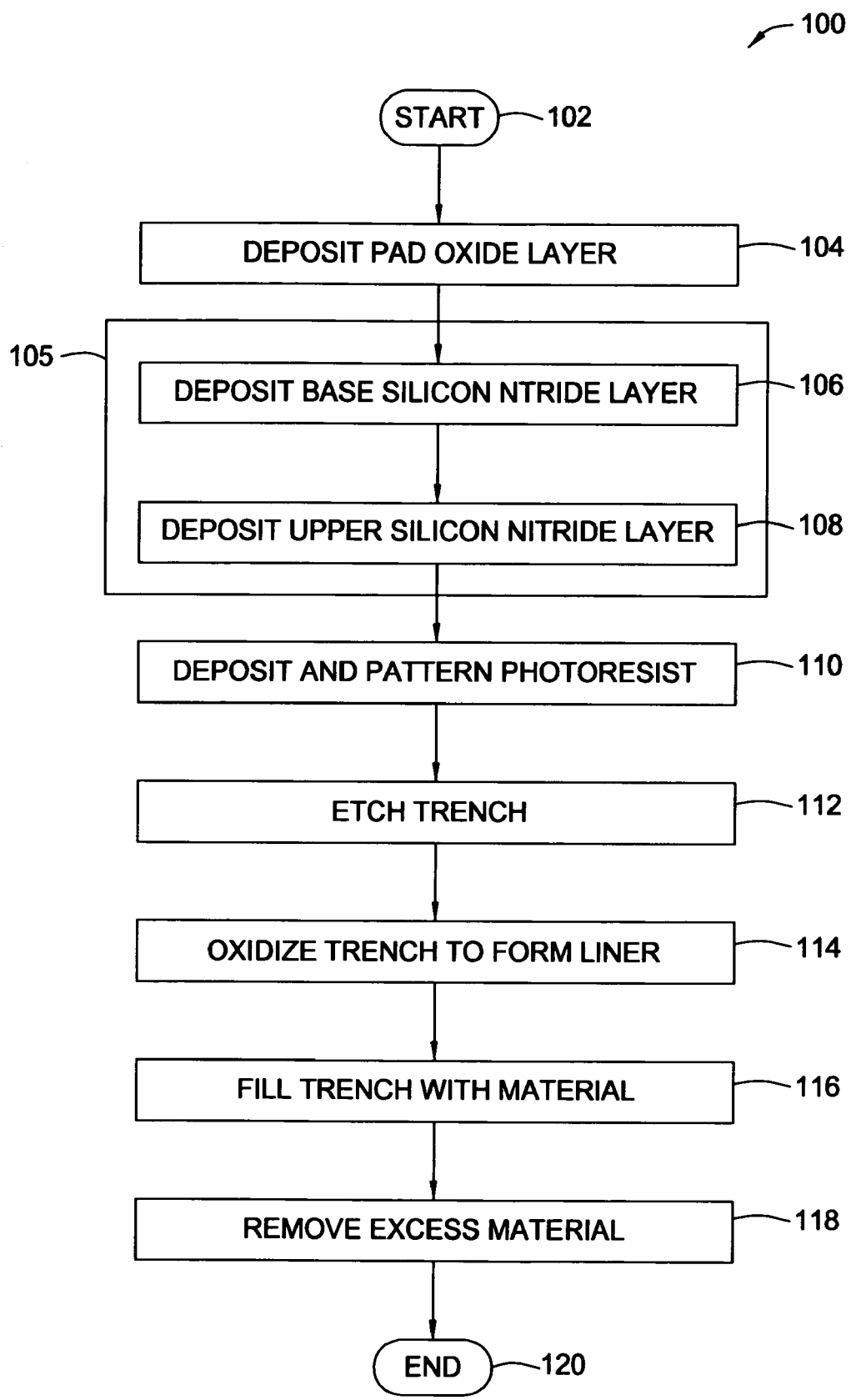
FIG. 1 depicts a flow diagram illustrating one embodiment of a method for fabricating a shallow trench isolation structure utilizing one embodiment of a silicon nitride stack of the present invention.

FIG. 1 depicts a flow diagram illustrating a method 100 for fabricating an STI structure in a substrate utilizing one embodiment of a silicon nitride stack in accordance with one embodiment of the present invention. The method 100 includes various processing steps performed upon a substrate during fabrication of the STI structure. Sub-steps and auxiliary procedures well known in the art (e.g., process control sub-steps, lithographic routines, and the like) are omitted herein for the sake of clarity.

FIGS. 2A-G together depict a series of schematic, cross-sectional views of a shallow trench isolation (STI) structure being formed in a substrate utilizing one embodiment of a silicon nitride stack using one embodiment of the method of FIG. 1. In the embodiment depicted in FIGS. 2A-G, the STI structure is formed in a region of a substrate 202 disposed between adjacent devices (not shown), for example transistors, to be subsequently formed on the substrate 202.

The cross-sectional views in FIGS. 2A-2G relate to individual processing steps performed to fabricate the STI structure in a substrate, for example, in connection with the fabrication of a FET. As such, prior and subsequent processing steps that may be performed on the substrate, for example, in connection with the fabrication of integrated circuits upon a semiconductor substrate, are not shown. In addition, the images in FIGS. 2A-2G are not depicted to scale and are simplified for illustrative purposes. To best understand the invention, the reader should simultaneously refer to FIGS. 1 and 2A-2G.

Figure 2A:
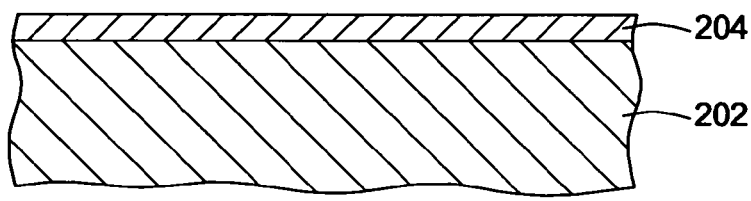
FIGS. 2A-G, together, depict a series of schematic, cross-sectional views of a shallow trench isolation structure fabricated using the method of FIG. 1.

The method 100 starts at step 102 and proceeds to step 104, where a pad oxide layer 204 is formed on the substrate 202, as depicted in FIG. 2A. Embodiments of the substrate 202 include, but are not limited to, semiconductor wafers, such as crystalline silicon (e.g., Si<100> or Si<111>), silicon oxide, strained silicon, silicon-on-insulator (SOI), silicon-germanium, doped or undoped polysilicon wafers, and the like. Optionally, prior to forming the STI structure, the substrate 202 may be pretreated by selectively performing processes such as polishing, annealing, baking, etching, reduction, oxidation, halogenation, hydroxylation, and the like. In one embodiment, the substrate 202 is a crystalline silicon wafer.

The pad oxide layer 204 may be formed to a thickness of about 100 to 500 Angstroms from, e.g., silicon oxide ($SiO_2$), silicon oxynitride (SiON), and the like. It is contemplated that other materials and thicknesses may be used to form the pad oxide layer 204 used in connection with the STI structures disclosed herein.

The pad oxide layer 204 may be formed in a suitable reactor, for example a low pressure chemical vapor deposition (LPCVD) reactor, among other suitable processing reactors known to those skilled in the art, such as chemical vapor deposition (CVD) reactors, atomic layer deposition (ALD) reactors, batch deposition reactors, and the like. An LPCVD reactor suitable for performing the inventive method is briefly discussed below with reference to FIG. 3. One LPCVD reactor suitable for performing the method 100 is a SiNgen® Plus LPCVD reactor available from Applied Materials, Inc. of Santa Clara, Calif.

A pad oxide layer 204 comprising $SiO_2$ may be formed using chemicals and processes disclosed in U.S. Pat. Ser. No. 6,713,127, issued Mar. 30, 2004 to Subramony, et al. (hereinafter the '127 patent), which is hereby incorporated by reference in its entirety. For example, a pad oxide layer 204 comprising $SiO_2$ may be formed using silicon source gases (such as silane, disilane, methylsilane, halogenated silanes, and the like) and oxidation source gases (such as oxygen, nitrous oxide, ozone, tetraoxysilane (TEOS), and the like). Correspondingly, a pad oxide layer 204 comprising SION may be deposited using the same chemicals as disclosed above for forming a silicon oxide layer along with a nitridation source gas, such as ammonia, hydrazine, and the like.

Using an LPCVD reactor, a pad oxide layer 204 comprising $SiO_2$ may be formed by providing silane ($SiH_4$) at about 1-100 sccm, optionally with a nitrogen carrier gas at about 1,000-15,000 sccm, and nitrous oxide ($N_2O$) at about 500-10,000 sccm (i.e., a $SiH_4$:$N_2O$ flow ratio ranging from 1:5 to 1:10,000), while maintaining a substrate temperature of about 650-800° C., and a chamber pressure of about 10-350 Torr. The duration of the deposition process is about 10-600 sec. One specific process provides silane at 20 sccm, nitrous oxide at 4,000 sccm (i.e., a $N_2O$:$SiH_4$ flow ratio of 200:1), and nitrogen at about 10,000 sccm, while maintaining a substrate temperature of 800° C. and a pressure of 200 Torr. Other examples of process conditions for depositing a doped silicon oxide second layer 214 are described in the previously incorporated '127 Patent Alternatively, a pad oxide layer 204 comprising SiON may be formed by providing silane ($SiH_4$) at about 1-100 sccm, optionally with a nitrogen carrier gas at about 1,000-15,000 sccm, and nitrous oxide ($N_2O$) at about 500-10,000 sccm (i.e., a $SiH_4$:$N_2O$ flow ratio ranging from 1:5 to 1:10,000), and a nitridation source gas, such as ammonia ($NH_3$) or hydrazine ($N_2H_4$) at about 40-10,000 sccm (i.e., a $SiH_4$:nitridation gas flow ratio ranging from 1:2 to 1:10,000), while maintaining a substrate pedestal temperature of about 650-800° C., and a chamber pressure of about 10-350 Torr. The duration of the deposition process is about 10 to 600 sec. One specific process provides silane at 20 sccm, nitrous oxide at 4,000 sccm (i.e., a $N_2O$:$SiH_4$ flow ratio of 200:1), and ammonia at about 4,000 sccm, and nitrogen at 6,000 sccm, while maintaining a substrate temperature of 800° C. and pressure of 275 Torr. Other examples of process conditions for depositing a doped silicon oxynitride second layer 214 are described in the previously incorporated '127 Patent.

Figure 2B:
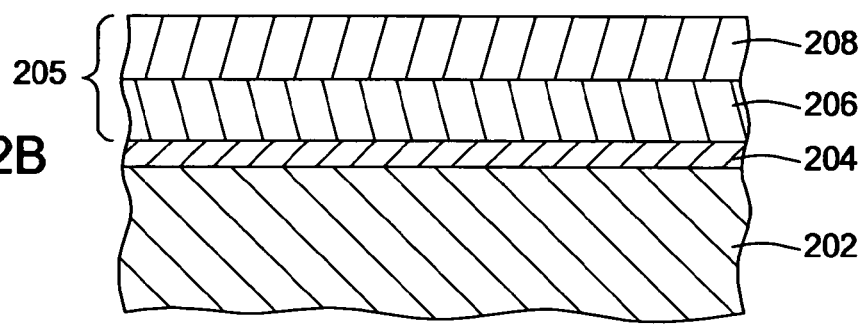

At step 105 a silicon nitride ($Si_3N_4$) stack 205 is deposited over the pad oxide layer 204, as depicted in FIG. 2B. In the embodiment depicted in FIGS. 1 and 2A-G, the silicon nitride stack 205 comprises a base silicon nitride layer 206 formed atop the pad oxide layer 204 (step 106) and an upper silicon nitride layer 208 formed atop the base silicon nitride layer 206 (step 108).

At step 106, the base silicon nitride layer 206 is deposited on the pad oxide layer 204. The base silicon nitride layer 206 may be deposited to a thickness of about 500-2,500 Angstroms. In one embodiment, base silicon nitride layer 206 is deposited to a thickness of about 1162.5 Angstroms. It is contemplated that layers having other thicknesses may optionally be utilized.

The base silicon nitride layer 206 has a low-stress interface with the pad oxide layer 204 to facilitate reduction in dislocations of the substrate 202, e.g., dislocations in the crystalline structure of a silicon substrate. The reduction in dislocations of the substrate 202 facilitates reduction in electrical leakage due to electron hopping along those dislocations in the substrate 202.

The base silicon nitride layer 206 may be formed using the illustrative chemistries and processes described below. Optionally, the base silicon nitride layer 206 may be doped with other elements. In one embodiment, the base silicon nitride layer 206 may be doped with at least one of boron (B), carbon (C), germanium (Ge), or hydrogen (H). Additional processes for forming silicon nitride and doped silicon nitride films are disclosed in U.S. patent application Ser. No. 11/245,373, filed on Oct. 6, 2005, by R. Suryanarayanan Iyer, et al., and entitled, "METHOD AND APPARATUS FOR THE LOW TEMPERATURE DEPOSITION OF DOPED SILICON NITRIDE FILMS," which is hereby incorporated by reference in its entirety.

In one embodiment, the base silicon nitride layer 206 may be formed using a mixture comprising a nitridation chemical and a silicon source chemical, each in a gaseous or liquid form. In one embodiment, the nitridation chemical comprises at least one of nitrogen ($N_2$), ammonia ($NH_3$), hydrazine ($N_2H_4$) and the like, and the silicon source chemical comprises at least one of bis(tertiary butylamino)silane (BTBAS), silane ($SiH_4$), disilane ($Si_2H_6$), dichlorosilane ($SiH_2Cl_2$), hexachlorodisilane ($Si_2Cl_6$), and the like.

In other embodiments, step 106 may use carbon-containing nitridation chemicals having a chemical formula R(C)—$C_xN_yR(N)$, where R(C) is hydrogen (H) or other hydrocarbon compound group, R(N) is nitrogen or other nitrogen containing compound group, and x and y are integers. Examples of suitable chemicals include $(CH_3)_3$—N, $H_3C$—$NH_2$, methylamine, $H_3C$—NH—$NH_2$, methylhydrazine, $(H_3C)$—N=N—H, and HC≡N, among other such chemicals.

In yet other embodiments, step 106 may use hydrogen-containing silicon source chemicals having chemical formulas $(SiR_3)_3$—N, $(SiR_3)_2$N—N$(SiR_3)_2$, or $(SiR_3)$N=$(SiR_3)$N, wherein R is hydrogen (H), a hydrocarbon reagent, or a fragment consisting of methyl, ethyl, phenyl, tertiary, butyl and combinations thereof. In one embodiment, R contains hydrogen and is free of halogens. In another embodiment, R contains hydrogen and one or more halogen elements. Examples of suitable silicon source chemicals include $(SiH_3)_3$—N, $(SiH_3)_2$N—N$(SiH_3)_2$, $(SiH_3)$N=$(SiH_3)$N, and trisilylamine, among other such chemicals. In addition, other source gases disclosed with respect to the other layer and steps described below may be utilized to form like materials in any of the layers described herein.

Doping chemicals may include, e.g., at least one of boron trichloride ($BCl_3$), borane ($BH_3$), diborane ($B_2H_6$), or other boron containing precursor as a source of boron, at least one of the carbon containing silicon precursors mentioned above as a source of carbon, at least one of germane ($GeH_4$) or digermane ($Ge_2H_6$) as a source of germanium, and at least one of hydrogen ($H_2$) or any of the hydrogen containing nitrogen or silicon precursors mentioned above as a source of hydrogen.

In one embodiment, the base silicon nitride layer 206 may be formed in an LPCVD reactor, such as a SiNgen® Plus 300 mm reactor, by providing ammonia ($NH_3$) at about 50-10,000 sccm, and disilane ($Si_2H_6$) at about 1-100 sccm (i.e., a $NH_3$:$Si_2H_6$ flow ratio ranging from 1:2 to 1:10,000), while maintaining a substrate pedestal temperature of about 650-800° C. and a chamber pressure of about 10-350 Torr. A carrier gas, such as nitrogen ($N_2$) may be provided in a range of about 3,000-15,000 sccm. The duration of the deposition process is about 10-600 seconds. One specific process provides 2,000 sccm $NH_3$, 40 sccm $Si_2H_6$ (i.e., a $NH_3$:$Si_2H_6$ flow ratio of 50:1), and 15,000 sccm $N_2$, while maintaining the substrate temperature at about 800° C. and the chamber pressure at about 100 Torr. Other examples of process chemistries and conditions for depositing a doped base silicon nitride layer 206 are described in the previously incorporated U.S. patent application Ser. No. 11/245,373.

The deposited silicon nitride base layer 206 using disilane and ammonia has excellent uniformity and higher deposition rates at a given temperature as compared to typical silane and ammonia processes. The disilane/ammonia process is able to achieve this because the activation energy for this process is much lower. In addition, the control of process recipes using the above-disclosed chemistries allows for control of the stress of the base silicon nitride layer 206 at the interface with the pad oxide layer 204. For example, the inventors have discovered that the stress of the base silicon nitride layer 206 may be controlled by the manipulation of certain process parameters. Specifically, the stress of the base silicon nitride layer 206 may be decreased by any or all of the following: increasing the disilane flow rate, increasing the total flow rate (the total flow rate is the sum of the flow rates of the silicon source, nitrogen source, and the carrier gas), or decreasing the chamber pressure.

At step 108, the upper silicon nitride layer 208 is deposited over the base silicon nitride layer 206. The upper silicon nitride layer 208 may be deposited to a thickness of about 100-2,000 Angstroms. In one embodiment, upper silicon nitride layer 208 is deposited to a thickness of about 387.5 Angstroms. It is contemplated that layers having other thicknesses may optionally be utilized. The total thickness of the silicon nitride stack 205 is generally between about 500-2500 Angstroms. The silicon nitride stack 205 may have a total thickness of About 1,550 Angstroms.

The upper silicon nitride layer 208 may be formed using the process chemistries described above in reference to step 106. However, the process parameters utilized to form the upper silicon nitride layer 208 may be selectively controlled to form a film having a high oxidation resistance, for example, to facilitate resistance of the silicon nitride stack 205 to subsequent oxidation processes that may be performed in the STI structure fabrication process. In addition, the upper silicon nitride layer 208 may further be controlled to have a refractive index (RI) that is optimized, for example, to facilitate photoresist deposition and patterning and subsequent trench etching steps in the STI structure fabrication process.

In one embodiment, the upper silicon nitride layer 208 may be formed in an LPCVD reactor, such as a SiNgen® Plus 300 mm reactor, by providing ammonia ($NH_3$) at about 50-10,000 sccm, and disilane ($Si_2H_6$) at about 1-100 sccm (i.e., a $NH_3$:$Si_2H_6$ flow ratio ranging from 1:2 to 1:10,000), while maintaining a substrate pedestal temperature of about 650-800° C. and a chamber pressure of about 10-350 Torr. A carrier gas, such as nitrogen ($N_2$) may be provided in a range of about 3,000-15,000 sccm. The duration of the deposition process is about 10-600 seconds. One specific process provides 4,000 sccm $NH_3$, 50 sccm $Si_2H_6$ (i.e., a $NH_3$:$Si_2H_6$ flow ratio of 80:1), and 8,000 sccm $N_2$, while maintaining the substrate temperature at about 800° C. and the chamber pressure at about 200 Torr. Other examples of process chemistries and conditions for depositing a doped upper silicon nitride layer 208 are described in the previously incorporated U.S. patent application Ser. No. 11/245,373.

Control of process recipes using the above-disclosed chemistries allows for control of the oxidation resistance and the RI of the upper silicon nitride layer 208. For example, the inventors have discovered that the oxidation resistance and the RI of the upper silicon nitride layer 208 may be controlled by the manipulation of certain process parameters. Specifically, the oxidation resistance of the upper silicon nitride layer 208 may be increased by increasing the $NH_3$:$Si_2H_6$ flow ratio. The increase of the $NH_3$:$Si_2H_6$ flow ratio also decreases the RI. In addition, the total flow, pressure, and spacing all play a role in controlling the RI of the upper silicon nitride layer 208. For example, increasing the process pressure and decreasing the total flow lowers the RI, and conversely, decreasing the process pressure and increasing the total flow raises the RI. As such, the oxidation resistance or the RI of the upper silicon nitride layer 208 may be optimized depending upon the desired characteristics of the upper silicon nitride layer 208, or the oxidation resistance and RI may be balanced to provide the optimum combination of the two characteristics in upper silicon nitride layer 208.

Optionally, one or more additional layers (not shown) may be deposited between the base silicon nitride layer 206 and the upper silicon nitride layer 208. The additional layers may comprise of silicon oxynitride, silicon nitride with C or B dopants. These additional layers provide flexibility of processing and facilitate control of the three key parameters: stress, RI, and oxidation resistance. Examples of process chemistries and conditions for the optional additional layers are described in U.S. patent application Ser. No. 11/273,381, filed herewith, by Iyer, et al., entitled "METHOD FOR FABRICATING CONTROLLED STRESS SILICON NITRIDE FILMS," and in U.S. patent application Ser. No. 11/253,229, filed Oct. 17, 2005, by Iyer, et al., entitled "METHOD FOR FABRICATING SILICON NITRIDE SPACER STRUCTURES," now U.S. Pat No. 7,294,581, both of which are hereby incorporated by reference in its entirety.

Figure 2C:
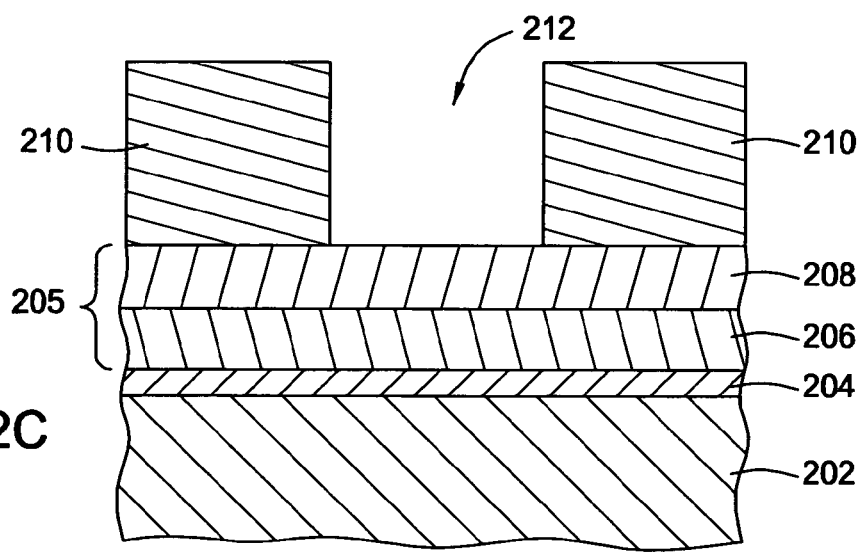

At step 110, a photoresist layer 210 is deposited on the upper silicon nitride layer 208 and patterned to form an opening 212, as depicted in FIG. 2C. The photoresist layer 210 may generally be formed to a thickness of about 2,000-8,000 Angstroms. However, it is contemplated that the thickness of the photoresist layer 210 may be any thickness suitable for subsequent processing and formation of the STI structure. The opening 212 is of a size and shape that corresponds to the region where the trench of the STI structure is to be formed. The photoresist layer 210 may deposited and patterned using conventional methods known in the art.

Figure 2D:
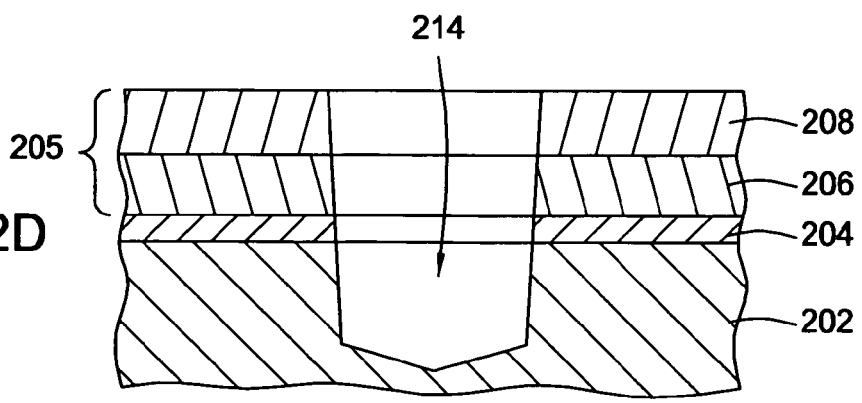

At step 112, using the patterned photoresist layer 210 as a mask, a trench 214 is etched through the silicon nitride stack 205 and the pad oxide layer 204 and into the substrate 202, as depicted in FIG. 2D. The trench 214 of the STI structure is generally about 2,000-4,000 Angstroms deep and about 1,000-3,000 Angstroms wide. However, it is contemplated that the depth and width of the trench 214 may be any suitable value for use as an STI structure. The trench 214 may be formed by conventional etch methods.

Figure 2E:
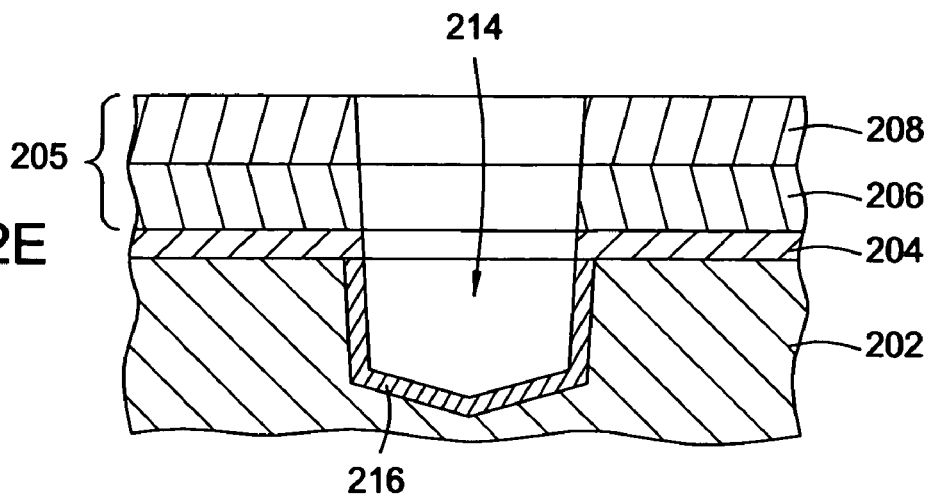

At step 114, the exposed surfaces of the trench (e.g., the substrate 202) are oxidized to form a trench liner 216, as depicted in FIG. 2E. The trench liner 216 generally comprises a layer of silicon oxide formed on the exposed surfaces of the substrate 202 that define the boundaries of the trench 214. The trench liner 216 is generally between about 50-200 Angstroms thick. However, it is contemplated that the thickness of the liner 216 may be any suitable value for use as a trench liner in an STI structure. The trench liner 216 may be formed by any suitable oxidation process, for example, an in-situ steam generation (ISSG) process in a rapid thermal processing (RTP) chamber, such as a RadOx™ chamber available from Applied Materials, of Santa Clara, Calif., or by furnace oxidation.

Figure 2F:
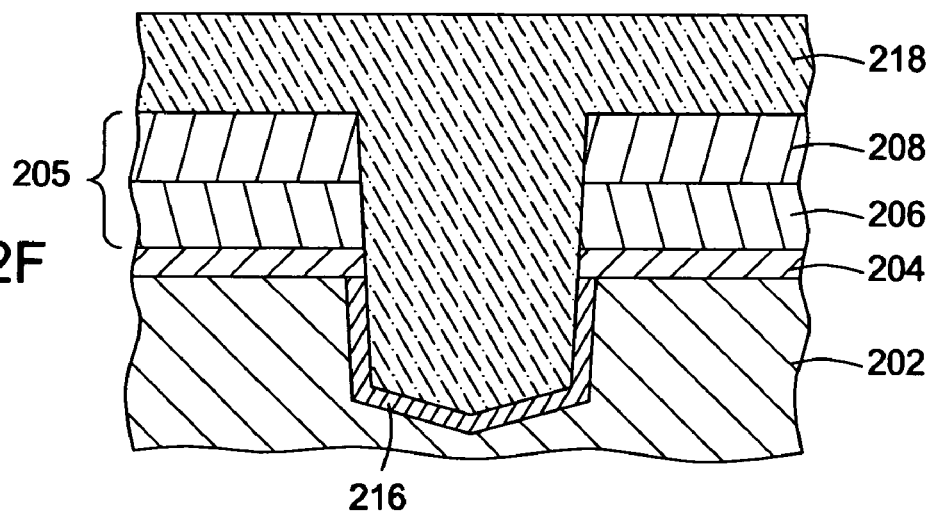
Figure 2G:
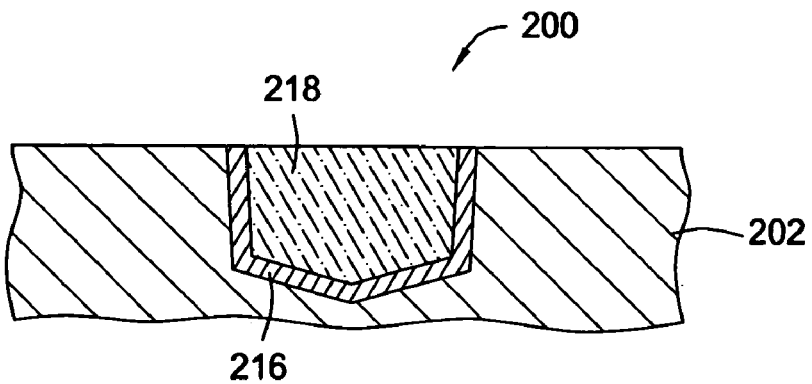

At step 116, a layer of material 218 is deposited to fill the trench 214, as depicted in FIG. 2F. The material 218 may comprise silicon oxide, boron and/or phosphorous doped silicon oxide, or the like. The material 218 is generally deposited in a manner that conformally coats the trench liner 216 and fills the trench 214. The material 218 may be deposited by any suitable method such as chemical vapor deposition (CVD), spin-on coating, and the like, as is known in the art.

At step 118, the excess material 218, the silicon nitride stack 205, and the pad oxide layer 204 are removed, leaving an STI structure 200 having an upper surface that is substantially flush with an upper surface of the substrate 202. The excess material may be removed by any suitable process, such as chemical mechanical polishing (CMP), etching, and the like. In one embodiment, the excess material 218, the silicon nitride stack 205, and the pad oxide layer 204 are removed by a CMP process followed by a nitride strip process. As such, the upper silicon nitride layer 208 of the stack must also meet requirements for CMP, which includes selectivity to oxide polishing, and requirements for wet etch rate, which includes etch selectivity to thermal oxide. These two requirements imposed by CMP and wet etch are in addition to the oxidation resistance and RI requirements discussed previously. Typically, if RI requirements are met, the wet etch and CMP requirements are met as well. For example, the inventors have discovered that similar to RI, wet etch rate (typically measured in comparison to thermally grown oxide) can be reduced by increasing the ammonia/disilane ratio and increasing the process chamber pressure.

Upon completion of step 118, at step 120, method 100 ends. After completion of the STI structure 200, additional processing may continue in the same or other process chambers to complete the formation of various devices on the substrate. For example, the substrate 202 having the STI structure 200 formed therein may undergo further processing to form transistors or other devices to be isolated from each other on either side of the STI structure 200.

Figure 3:
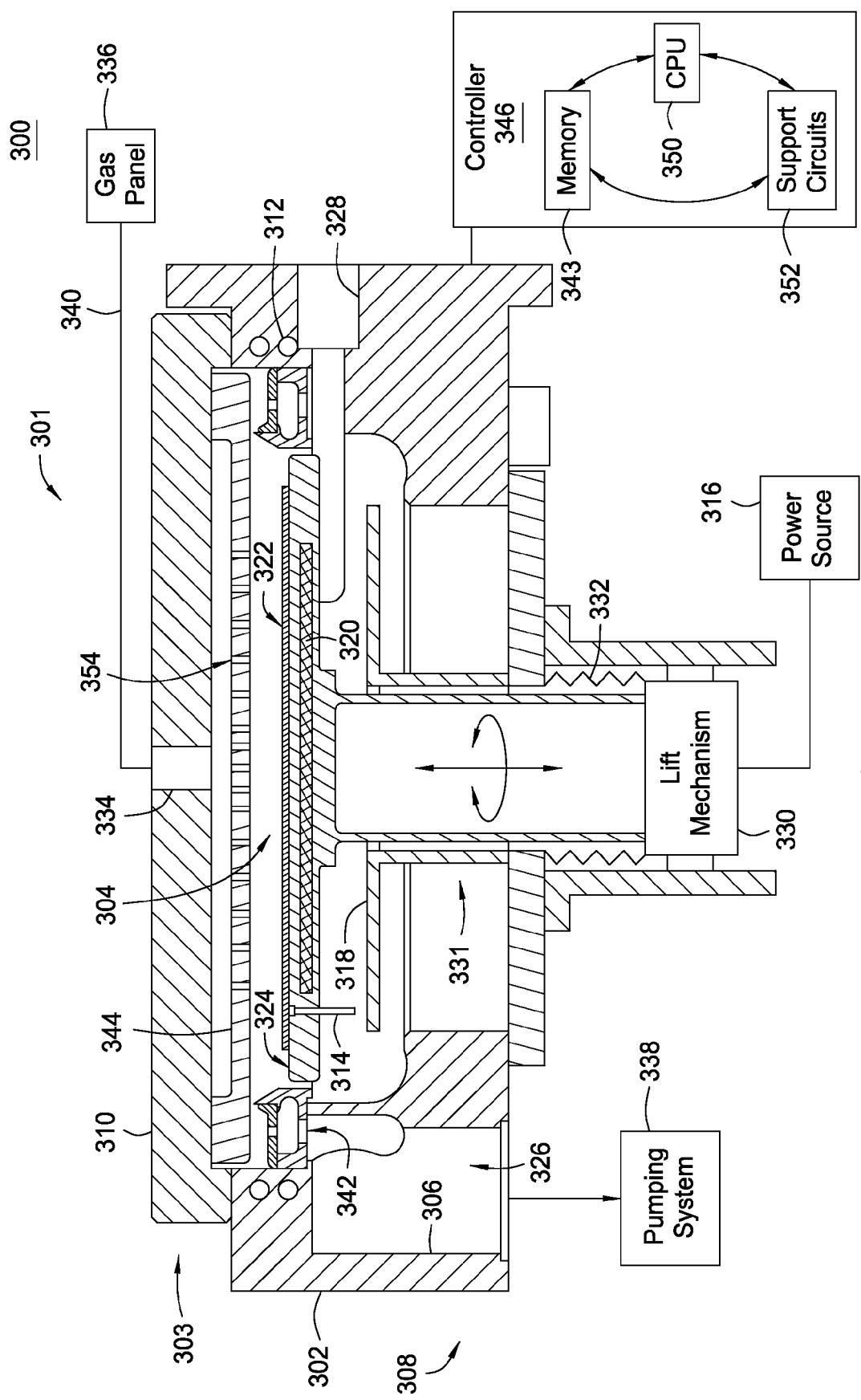
FIG. 3 depicts a schematic diagram of an exemplary CVD reactor of the kind that may be used to practice portions of the method of FIG. 1.

FIG. 3 depicts a schematic diagram of one exemplary LPCVD reactor 300 that may be used to practice portions of the method 100 of FIG. 1. Other examples of suitable LPCVD reactors are described in U.S. patent application Ser. No. 10/911,208, filed Aug. 4, 2004 by Iyer, et al., and U.S. patent application Ser. No. 11/147,938, filed Jun. 8, 2005 by Smith, et al. In the embodiment depicted in FIG. 3, the reactor 300 comprises a processing chamber 301, a pumping system 338, a gas panel 336, a power source 316, and a controller 346.

The processing chamber 301 generally includes an upper assembly 303, a bottom assembly 308, and a pedestal lift assembly 331. The upper assembly 303 generally comprises a lid 310 having an inlet port 334 and a showerhead 344. The bottom assembly 308 houses a substrate support pedestal 324 and comprises a chamber body 302 having a wall 306. A substrate access port 328 is formed in the chamber body 302 to facilitate entry and egress of a substrate 322 into and out of the processing chamber 301. The pedestal lift assembly 331 is coupled to the substrate support pedestal 324 and comprises a lift mechanism 330, a lift plate 318 and a set of lift pins 314.

The substrate support pedestal 324 is disposed in an internal volume 304 of the processing chamber 301 and, during processing, supports the substrate 322. The pedestal 324 includes a heater 320 configured to regulate the temperature of the substrate 322 and/or temperature in the internal volume 304. The heater 320 is coupled to the power source 316 and capable of maintaining the substrate 322 at a temperature of up to about 800° C.

The showerhead 344 provides, through a plurality of openings 354, distribution of gases or vapors delivered from the gas panel 336. Size, geometry, number, and location of the openings 354 are selectively chosen to facilitate a predefined pattern of gas/vapor flow to the substrate 322.

The gas panel 336 provides process chemicals, in liquid and/or gaseous form, to the processing chamber 301. The gas panel 336 is coupled to the lid 310 using a plurality of gas lines 340. Each gas line 340 may be selectively adapted for transferring specific chemical(s) from the gas panel 336 to the inlet port 334, as well as be temperature controlled.

In operation, the pedestal lift assembly 331 controls the elevation of the pedestal 324 between a processing position (as shown in FIG. 3) and a lowered position from which the substrate 322 may transported, through the substrate access port 328, into and out of the processing chamber 301. The assembly 301 is sealingly coupled to the chamber body 302 using a flexible bellows 332 and, optionally, is configured to rotate the substrate support pedestal 324.

The wall 306 may be thermally regulated. In one embodiment, a plurality of conduits 312 are disposed in the wall 306 and configured to circulate a heat transfer fluid regulating the temperature of the wall.

The pumping system 338 is coupled to a pumping port 326 formed in the wall 306. The pumping system 338 generally includes a throttle valve and one or more pumps arranged to control the pressure in the internal volume 304. Gases flowing out of the processing chamber 301 are routed through a pumping ring 342 to enhance gas flow uniformity across the surface of the substrate 322. One such pumping ring is described in U.S. patent Ser. No. 10/911,208, filed Oct. 4, 2004, by Iyer, et al., and entitled "Thermal Chemical Vapor Deposition of Silicon Nitride Using BTBAS Bis(Tertiary-Butylamino Silane) in a Single Wafer Chamber," which is herein incorporated by reference.

In alternate embodiments (not shown), the reactor 300 may comprise a photoexitation system delivering radiant energy to the substrate 322 through windows in the lid 310, as well as a remote plasma source coupled to the inlet port 334.

The system controller 346 generally comprises a central processing unit (CPU) 350, a memory 343, and support circuits 352 and is coupled to and controls modules and apparatuses of the reactor 300. In operation, the controller 346 directly controls modules and apparatus of the system 300 or, alternatively, administers computers (and/or controllers) associated with these modules and apparatuses.

The invention may be practiced using other processes and/or processing apparatuses where parameters are adjusted to achieve acceptable characteristics by those skilled in the art without departing from the spirit of the invention. Although the forgoing discussion referred to fabrication of an STI structure of a field effect transistor, fabrication of other devices and structures used in integrated circuits can also benefit from the invention.

Thus, a method of forming a silicon nitride stack having controlled characteristics at various locations in the stack is provided herein. In the manufacture of integrated circuits, the method 100 advantageously utilizes characteristics of component layers and forms multiple layer silicon nitride films having controlled properties, such as stress, oxidation resistance, and RI, at desired locations in the film, such as at the base layer and at the exposed, upper layer. The silicon nitride stack may advantageously be utilized to form structures on the substrate, such as STI structures, having reduced electrical leakage due to electron hopping along dislocations in the substrate. The STI structure manufacturing method is also enhanced due to the oxidation resistance and RI optimization of the multiple layer silicon nitride stack.

While the foregoing is directed to embodiments of the present invention, other and further embodiments of the invention may be devised without departing from the basic scope thereof, and the scope thereof is determined by the claims that follow.

What is claimed is:

1. A method for fabricating a silicon nitride stack on a semiconductor substrate, comprising:
    (a) depositing a base layer comprising silicon nitride on the semiconductor substrate using a first set of process conditions that selectively control a stress of the base layer; and
    (b) depositing an upper layer comprising silicon nitride using a second set of process conditions that selectively control at least one of an oxidation resistance and a refractive index of the upper layer.

2. The method of claim 1, wherein the first set of process conditions that selectively control the stress of the base layer includes at least one of a silicon source gas flow, a total gas flow, and a chamber pressure.

3. The method of claim 1, wherein the second set of process conditions that selectively control at least one of an oxidation resistance and a refractive index of the upper layer includes a nitrogen source gas to silicon source gas flow ratio.

4. The method of claim 1, wherein the silicon nitride is deposited using disilane and ammonia.

5. The method of claim 1, wherein step (a) further comprises minimizing the stress of the base layer.

6. The method of claim 1, wherein step (b) further comprises maximizing the oxidation resistance of the upper layer.

7. The method of claim 1, wherein step (b) further comprises optimizing the refractive index of the upper layer.

8. The method of claim 1, further comprising:
    depositing one or more intervening layers comprising silicon nitride between the base and upper layers of the stack.

9. A method of forming a shallow trench isolation structure in a substrate, comprising:
    (a) depositing a pad oxide layer on the substrate;
    (b) depositing a silicon nitride stack having a base layer and an upper layer, wherein a stress of the base layer is selectively controlled by a first set of deposition conditions and wherein at least one of an oxidation resistance and a refractive index of the upper layer are selectively controlled by a second set of deposition conditions;
    (c) depositing and patterning a photoresist layer on the substrate;
    (d) etching a trench into the substrate through the pad oxide layer and silicon nitride stack;
    (e) oxidizing the trench to form a liner;
    (f) filling the linered trench with silicon oxide; and
    (g) removing excess silicon oxide.

10. The method of claim 9, wherein the first set of process conditions that selectively control the stress of the base layer includes at least one of a silicon source gas flow, a total gas flow, and a chamber pressure.

11. The method of claim 9, wherein the second set of process conditions that selectively control at least one of an oxidation resistance and a refractive index of the upper layer includes a nitrogen source gas to silicon source gas flow ratio.

12. The method of claim 9, wherein the silicon nitride is deposited using disilane and ammonia.

13. The method of claim 9, wherein step (b) further comprises minimizing the stress of the base layer.

14. The method of claim 9, wherein step (b) further comprises maximizing the oxidation resistance of the upper layer.

15. The method of claim 9, wherein step (b) further comprises optimizing the refractive index of the upper layer.

16. The method of claim 9, further comprising:
    depositing one or more intervening layers comprising silicon nitride between the base and upper layers of the stack.

17. The method of claim 9, wherein the base layer is about 500-2,500 Angstroms thick.

18. The method of claim 9, wherein the upper layer is about 100-2,000 Angstroms thick.

19. The method of claim 9, wherein the silicon nitride stack has a total thickness of about 500-2,500 Angstroms.

20. The method of claim 9, wherein the silicon nitride stack has a total thickness of about 1,550 Angstroms.

* * * * *